United States Patent
Baek

(10) Patent No.: US 10,529,947 B2
(45) Date of Patent: Jan. 7, 2020

(54) DISPLAY DEVICE

(71) Applicant: SAMSUNG DISPLAY CO., LTD., Yongin-si, Gyeonggi-do (KR)

(72) Inventor: Seokgi Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 15/189,939

(22) Filed: Jun. 22, 2016

(65) Prior Publication Data
US 2017/0033311 A1    Feb. 2, 2017

(30) Foreign Application Priority Data

Jul. 27, 2015    (KR) .......................... 10-2015-0106061

(51) Int. Cl.
*G02F 1/1335*    (2006.01)
*H01L 51/52*    (2006.01)

(52) U.S. Cl.
CPC ................................ *H01L 51/5246* (2013.01)

(58) Field of Classification Search
CPC .......................... G06F 3/0412; G02F 1/133526
See application file for complete search history.

(56) References Cited

U.S. PATENT DOCUMENTS

| | | |
|---|---|---|
| 2012/0162563 A1 | 6/2012 | Lai et al. |
| 2014/0140037 A1* | 5/2014 | Cho .......................... F21V 9/14 362/19 |
| 2016/0211397 A1* | 7/2016 | Kerzabi ............ G02F 1/133526 |
| 2016/0245961 A1* | 8/2016 | Akasaka ............. G02B 3/0068 |

FOREIGN PATENT DOCUMENTS

| | | |
|---|---|---|
| KR | 20-0254130 Y1 | 11/2001 |
| KR | 10-0879207 B1 | 1/2009 |
| KR | 10-2013-0097048 A | 9/2013 |
| KR | 10-1322951 B1 | 10/2013 |
| KR | 10-1489955 B1 | 2/2015 |

* cited by examiner

*Primary Examiner* — Edmond C Lau
(74) *Attorney, Agent, or Firm* — Lewis Roca Rothgerber Christie LLP

(57) ABSTRACT

A display device includes: a display panel divided into a display area and a peripheral area, the peripheral area being adjacent to the display area; a cover member on the display panel, the cover member being divided into a transmission area overlapping with the display area and a bezel area overlapping with the peripheral area; and a light guide member between the cover member and the display panel, the light guide member including a base member including at least one recessed portion overlapping with the peripheral area, and a filling portion at the recessed portion.

14 Claims, 7 Drawing Sheets

DISPLAY DEVICE

CROSS-REFERENCE TO RELATED APPLICATION

This U.S. non-provisional patent application claims priority to and the benefit of Korean Patent Application No. 10-2015-0106061, under 35 U.S.C. § 119, filed on Jul. 27, 2015, in the Korean Intellectual Property Office, the entire contents of which are hereby incorporated by reference.

BACKGROUND

1. Field

One or more aspects of example embodiments of the present disclosure herein relate to a display device, and more particularly, to a thin type display device.

2. Description of the Related Art

A variety of display devices are developed for multimedia devices, such as TVs, mobiles, navigations, computer monitors, game devices, and the like. Recently, the display devices are implemented with a plurality of layers that are laminated to reduce thickness in accordance with a trend of being light-weight and slim. The laminated structure of the display devices may be defined in consideration of visibility and reliability of the display devices.

The above information disclosed in this Background section is for enhancement of understanding of the background of the invention, and therefore, it may contain information that does not constitute prior art.

SUMMARY

One or more example embodiments of the present disclosure provide a display device in which a light leakage phenomenon that may be caused by a thin thickness is reduced or prevented.

According to an embodiment of the inventive concept, a display device includes: a display panel divided into a display area and a peripheral area, the peripheral area being adjacent to the display area; a cover member on the display panel, the cover member being divided into a transmission area overlapping with the display area and a bezel area overlapping with the peripheral area; and a light guide member between the cover member and the display panel, the light guide member including a base member including at least one recessed portion overlapping with the peripheral area, and a filling portion at the recessed portion.

In an embodiment, the base member may have a lower surface facing the display panel and an upper surface opposite the lower surface, and the recessed portion may be recessed from the lower surface in a thickness direction of the base member.

In an embodiment, the filling portion may have a lower refractive index than that of the base member.

In an embodiment, the base member may include a plastic substrate.

In an embodiment, the base member may include an optical clear adhesive (OCA) member, a pressure sensitive adhesive (PSA) member, or an optical clear resin (OCR) member.

In an embodiment, the filling portion may include air.

In an embodiment, the recessed portion may include a plurality of recessed portions, and the plurality of recessed portions may overlap with at least the bezel area at a lower side of a base substrate of the cover member.

In an embodiment, the plurality of recessed portions may further overlap with the transmission area at the lower side of the base substrate.

In an embodiment, each of the plurality of recessed portions may have a semicircular shape in a cross section.

In an embodiment, each of the recessed portions may have a triangular shape in a cross section.

In an embodiment, the cover member may include: a base substrate overlapping with the transmission area and the bezel area; and a color layer under the base substrate and defining the bezel area.

In an embodiment, the color layer may be configured to reflect incident light.

In an embodiment, the display device may further include a touch member between the light guide member and the cover member, the touch member being configured to detect an external touch signal.

According to an embodiment of the inventive concept, a display device includes: a display panel configured to display an image; a cover member on the display panel, the cover member being divided into a transmission area for transmitting the image and a bezel area adjacent to the transmission area, and the cover member being curved based on a first direction; and a light guide member between the cover member and the display panel, the light guide member including a base member including recessed portions, and a filling portion at the recessed portions, and at least one of the recessed portions overlaps with the bezel area.

In an embodiment, each of the recessed portions may be recessed from a lower surface of the base member in a thickness direction of the base member.

In an embodiment, the display panel may include: a base layer; a display layer on the base layer and including a plurality of pixels on a display area; and a sealing layer on the display layer and cover membering the pixels, and the display panel may be curved along the first direction.

In an embodiment, the filling portion may have a lower refractive index than that of the base member.

In an embodiment, the filling portion may include air.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept, and together with the description, serve to describe aspects and features of the inventive concept. In the drawings.

DETAILED DESCRIPTION

Figure 1:
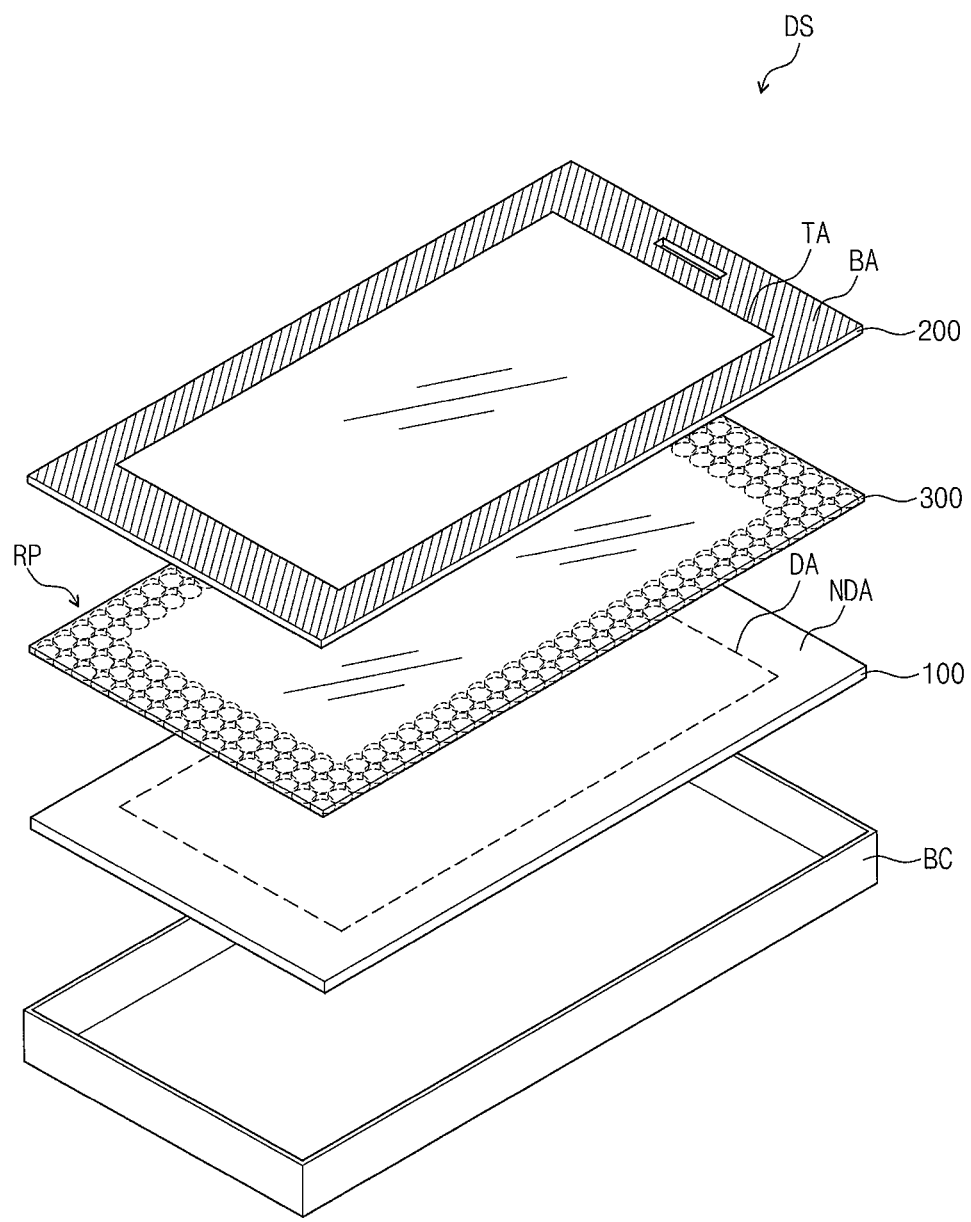
FIG. 1 is an exploded perspective view of a display device in accordance with an embodiment of the present inventive concept.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
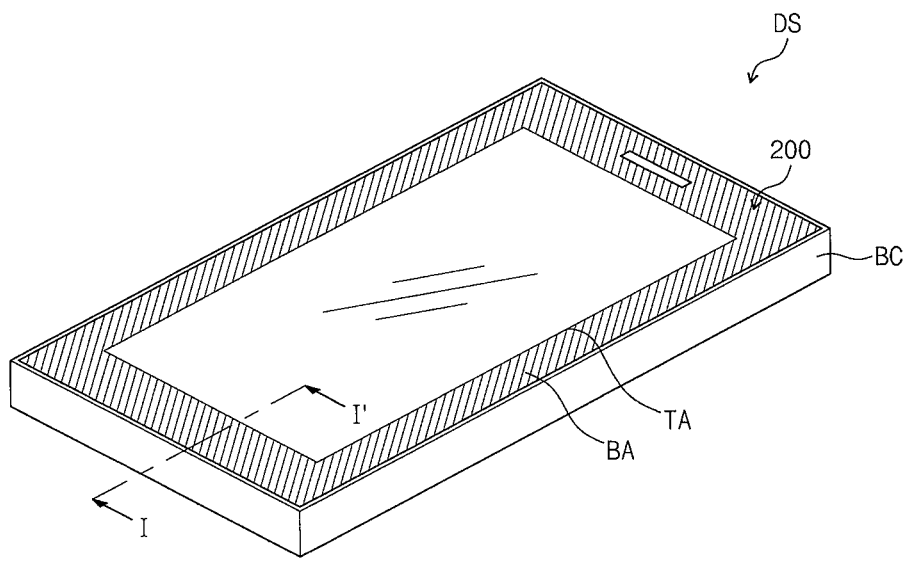
FIG. 2A is a perspective view of the display device shown in FIG. 1 in a coupled state.
Figure 2B:
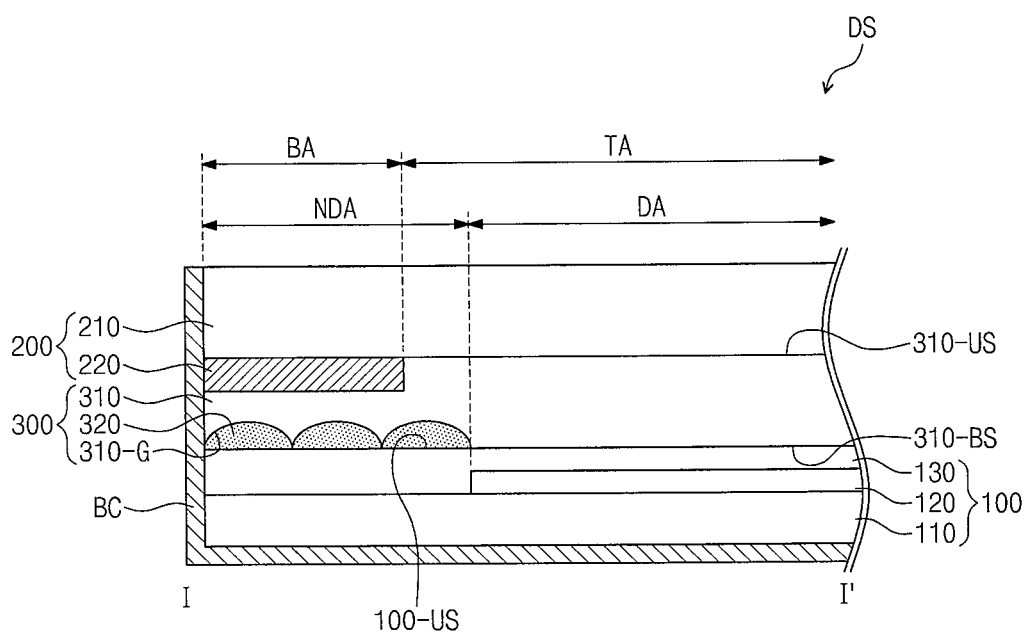
FIG. 2B is a cross-sectional view taken along the line I-I' of FIG. 2A.

FIG. 1 is an exploded perspective view of a display device in accordance with an embodiment of the inventive concept. FIG. 2A is a perspective view of the display device in FIG. 1 in a coupled state. FIG. 2B is a partial cross-sectional view taken along the line I-I' in FIG. 2A. An example embodiment of the present disclosure will now be described with reference to FIGS. 1 to 2B.

A display device DS includes a display panel 100, a cover member (or cover) 200, a light guide member (or light guide) 300, and a housing member (or housing) BC.

The housing member BC defines the appearance of the display device DS. The housing member BC also defines an inner space (e.g., a predetermined inner space). The display panel 100, the cover member 200, and the light guide member 300 are housed in the inner space.

The display panel 100 receives an electrical signal and displays an image. The display panel 100 may include an organic light emitting display panel, a liquid crystal display panel, an electrophoretic display panel, and/or an electrowetting display panel. However, the display panel in accordance with the inventive concept is not limited thereto, and the display panel 100 may include any suitable display panel known to those skilled in the art.

The display panel 100 may be divided on a plane into a display area DA and a peripheral area NDA. The display area DA may be defined at a central portion of the display panel 100.

A plurality of pixels are located on the display area DA. The pixels display corresponding lights in accordance with electrical signals. Accordingly, an image is displayed on the display area DA.

The peripheral area NDA may be adjacent to the display area DA. The peripheral area NDA may have a frame shape and may surround the display area DA.

The image may not be displayed on the peripheral area NDA by the electrical signal. A connector and/or a driving part (e.g., a driver) for driving a variety of signal lines configured to deliver the electrical signals may be located in the peripheral area.

The display panel 100 includes a base layer 110, a display layer 120, and an encapsulation layer 130. The base layer 110 overlaps with the display area DA and the peripheral area NDA. The base layer 110 may include an insulation substrate.

The display layer 120 is located on the base layer 110. The display layer 120 includes the pixels. Each of the pixels includes at least one thin film transistor and a display element that is electrically connected to the thin film transistor.

For example, the display element may be an organic light emitting diode, a liquid capacitor, an electro-wetting element, and/or an electrophoretic element. However, the display element in accordance with the inventive concept is not limited thereto, and the display element may be implemented with a variety of suitable display elements. For convenience, an organic light emitting display panel including organic light emitting elements is described as an example.

The encapsulation layer 130 is located on the display layer 120. The encapsulation layer 130 may protect the display layer 120 from the outside, and may insulate the display layer 120.

The encapsulation layer 130 is made of a transparent insulation material. For example, the encapsulation layer 130 may include an insulation substrate including, for example, a plastic substrate. Accordingly, the rigidity of the encapsulation layer 130 may be improved, and the reliability of the display device DS may be improved. According to an example embodiment, air between the encapsulation layer 130 and the display layer 120 may be removed or may be prevented from being disposed therein.

However, the encapsulation layer is not limited thereto, for example, according to another embodiment, the encapsulation layer 130 may include a laminated film in which an organic film and/or an inorganic film may be alternately laminated. Accordingly, the encapsulation layer 130 may be provided as a thin film, so that the flexibility of the display device DS may be improved. However, the present inventive concept is not limited to the above example embodiments, and the encapsulation layer 130 may be provided in a variety of suitable encapsulation layers.

The cover member 200 is located on the display panel 100. The cover member 200 is coupled with the housing member BC, and defines the appearance of the display device DS. The cover member 200 protects the display panel 100 and the light guide member 300.

The cover member 200 is located on the display panel 100. The cover member 200 covers a surface (e.g., a front or top surface) of the light guide member 300. According to an example embodiment of the present inventive concept, the cover member 200 may include a window of the display device DS.

The cover member 200 may be divided on a plane into a transmission area TA and a bezel area BA. The transmission area TA overlaps with the display area DA. The transmission area TA transmits incident light. A user views the image displayed on the display area DA through the transmission area TA.

The bezel area BA overlaps with the peripheral area NDA. The bezel area BA is provided so that a circuit wiring and/or a peripheral portion of the display layer 230 at the peripheral area NDA may not be viewable from the outside.

The bezel area BA has a color (e.g., a predetermined color). The bezel area BA may generally reflect and/or absorb incident light. The user may view the color of the bezel area BA from the outside.

The cover member 200 includes a base substrate 210 and a color layer 220 in a cross section. The base substrate 210 overlaps with the bezel area BA and the transmission area TA. The base substrate 210 defines or substantially defines the transmission area TA.

The base substrate 210 may be made of a transparent insulation material. The base substrate 210 may include a transparent material having high transmittance, so that the visibility of the image displayed on the display area DA is improved.

For example, the base substrate 210 may be made of a transparent plastic or glass. The above description, however, is only exemplary, and the base substrate 210 may be made of a variety of suitable materials having high transmittance, and is not limited to any of those materials described above.

The color layer 220 is located on a surface (e.g., a rear or bottom surface) of the base substrate 210. The color layer 220 defines or substantially defines the bezel area BA. Accordingly, the color layer 220 may be patterned on the surface (e.g., the rear or bottom surface) of the base substrate 210, so that the color layer has a corresponding shape with the peripheral area NDA.

The color layer 220 may be made of a material having high light reflectance and/or high light absorption. For example, the color layer 220 may be made of a metal, a color particle, and/or an ink. However, the present inventive concept is not limited thereto, and the color layer 220 may be made of any suitable material for reflecting light and/or having a color (e.g., a predetermined color).

The color layer 220 may have a variety of colors, for example, ranging from white color series having high brightness to black color series having low brightness (e.g., and any suitable colors therebetween).

In the display device DS in accordance with an embodiment of the inventive concept, the color layer 220 may be made of a material having high light reflectance. For example, the color layer 220 includes a metal, a white pigment particle, and/or an ink.

When the light reflectance of the color layer 220 is high, and/or the brightness of the color layer 220 increases, the light leakage phenomenon may easily occur. The display device DS may prevent or reduce the light leakage phenomenon by including the light guide member 300.

The light guide member 300 is located between the display panel 100 and the cover member 200. The light guide member 300 includes a recessed pattern RP located at a portion of the light guide member 300. An area (e.g., the portion) at which the recessed pattern RP is located and another area (e.g., another portion) at which the recessed pattern RP is not located may have refractive indexes that are different from each other.

The light guide member 300 includes a base member 310 and a filling portion 320. The base member 310 includes an upper surface 310-US and a lower surface 310-BS that oppose (e.g., are opposite to) each other. The upper surface 310-US faces the cover member 200, and the lower surface 310-BS faces the display panel 100. A minimum distance between the upper surface 310-US and the lower surface 310-BS may be defined as the thickness of the base member 310.

The base member 310 overlaps with the display area DA and the peripheral area NDA. The base member 310 may be made of a material having high transmittance. Accordingly, the base member 310 may include an insulation substrate, such as a plastic substrate or a glass substrate.

Alternatively, the base member 310 may be made of an adhesive material. For example, the base member 310 may include an optical clear adhesive (OCA), a pressure sensitive adhesive (PSA), and/or an optical clear resin (OCR).

In this case, the base member 310 couples the cover member 200 with the display panel 100. Further, the base member 310 may remove a step height difference, which may be generated in the cover member 200 by the color layer 220 and the base substrate 210. However, the present inventive concept is not limited thereto, and the base member 310 may be made of a variety of suitable materials within a range that does not affect visibility of the display area DA.

In the base member 310, at least one recessed portion 310-G is defined. The recessed portion 310-G, according to an example embodiment, may be disposed (e.g., formed) in a plurality. The plurality of recessed portions 310-G are defined in an area overlapping with the peripheral area NDA.

The recessed portions 310-G are recessed in a thickness direction of the base member 310 from the rear surface 310-BS of the base member 310. Accordingly, the recessed portions 310-G may have an upward convex shape in a cross-section. The shape of the recessed portions 310-G defines a shape of the recessed pattern RP.

In FIG. 2B, each of the recessed portions 310-G having a semicircular shape in a cross section is illustrated as an example. However, the present inventive concept is not limited thereto, and each of the recessed portions 310-G may have a variety of suitable shapes, such as a semi-oval shape, a triangular shape, and/or a polygonal shape. A detailed description regarding the shape of the recessed portions 310-G will be described later.

The recessed portions 310-G cover at least the bezel area BA from below the rear surface of the base substrate 210. Accordingly, an area in which the recessed portions 310-G are defined may include at least the bezel area BA.

Further, as shown in FIG. 2B, the recessed portions 310-G may overlap with at least a portion of the transmission area TA. That is, the recessed portions 310-G may further cover at least a portion of the transmission area TA, in addition to covering the bezel area BA, from below the rear surface of the base substrate 210.

Accordingly, the recessed portions 310-G may protrude towards the rear surface of the base substrate 210 inside of the bezel area BA on the plane. The area in which the recessed portions 310-G are defined on the plane may be larger than that of the bezel area BA.

The filling portion 320 fills the recessed portions 310-G. For example, the filling portion 320 fills a space (e.g., a predetermined space) defined by the recessed portions 310-G that are upwardly recessed from the rear surface 310-BS of the base member 310.

The filling portion 320 may have a lower refractive index than that of the base member 310. For example, the filling portion may include air. Accordingly, the filling portion may be defined as an empty void. However, the present inventive concept is not limited thereto, and the filling portion 320 may include a variety of suitable materials having a refractive index lower than that of the base member 310.

The recessed pattern RP is defined or substantially defined by the recessed portions 310-G and the filling portion 320 filled in the recessed portions 310-G. The shape of the recessed pattern is determined by the recessed portions 310-G, and the refractive index of the recessed pattern RP is determined by that of the filling portion 320.

According to one or more embodiments of the present disclosure, the display device DS may prevent or reduce light (e.g., a portion of light) that is generated in the display panel 100 from leaking through the peripheral area NDA and through the bezel area BA by further including the filling portion 320 that has a relatively lower refractive index than that of the surrounding area. The filling portion 320 guides the light that is leaking out, so that the light that is leaking out through the bezel area BA is not emitted to the outside. A detailed description for the above will be described later.

Figure 3A:
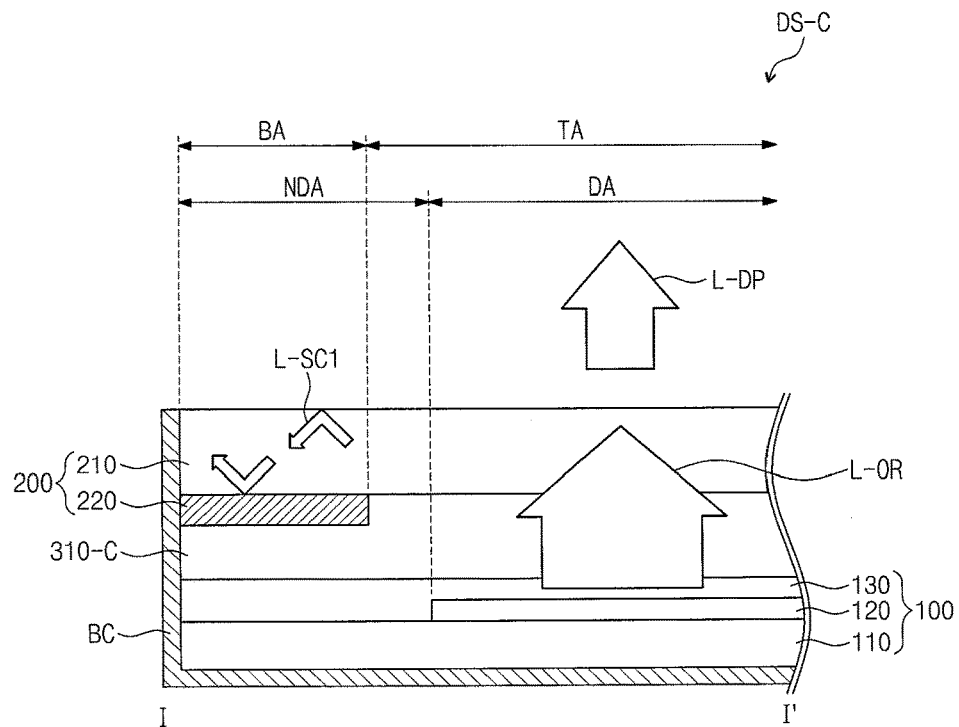
FIG. 3A is a partial cross-sectional view illustrating a light path of a display device.
Figure 3B:
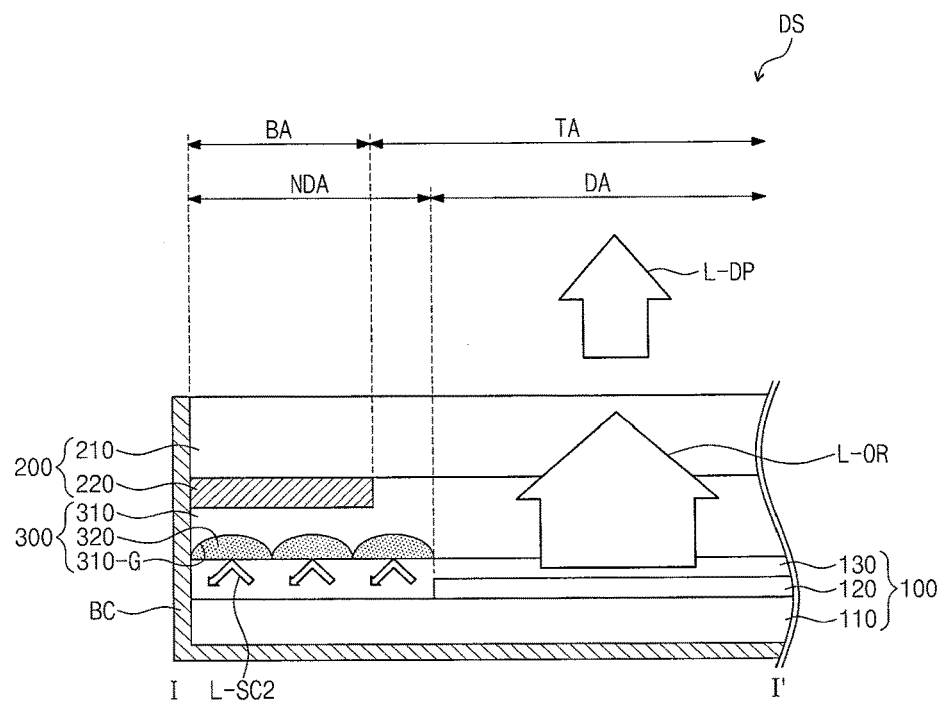
FIG. 3B is a partial cross-sectional view illustrating a light path of a display device in accordance with an embodiment of the present inventive concept.

FIG. 3A is a partial cross-sectional view illustrating a light path of a display device. FIG. 3B is a partial cross-sectional view illustrating a light path of a display device in accordance with an embodiment of the inventive concept. For convenience of explanation, FIG. 3A and FIG. 3B illustrate an area of the display device corresponding to the area shown in FIG. 2B.

In a display device DS-C in accordance with the display device of FIG. 3A and a display device DS in accordance with an example embodiment of the present disclosure, configurations of elements other than the light guide member 300 are the same or substantially the same. Accordingly, the same reference numerals are given to the same or substantially the same elements as those illustrated in FIG. 1 through FIG. 2B, and duplicate description thereof will be omitted.

As shown in FIG. 3A and FIG. 3B, when power is applied to a display panel 100, the display panel 100 generates light L-OR to implement an image, and emits the light L-OR towards the outside (e.g., the upper side of the display panel 100). A light L-DP, which is displayed on the display area DA, from among the lights that implement the image is viewed from the outside through the transmission area TA, and provides information (e.g., the image) to a user.

The display panel 100 has a laminate structure including a plurality of layers, and may be thinner than that of other display panels. As the display panel 100 becomes thinner, a portion of the light L-OR may leak through the plurality of layers to the peripheral area NDA and the bezel area BA. Accordingly, leaking lights L-SC1 and L-SC2 may be respectively generated in the display device DS-C as shown in FIG. 3A and in the display device DS in accordance with the present disclosure as shown in FIG. 3B.

As shown in FIG. 3A, the display device DS-C does not include the light guide member 300. More particularly, the display device DS-C includes a base member (or base) 310-C in which a recessed portion is not defined.

In this case, the base member 310-C in which the recessed portion is not defined may be an adhesive member (or adhesive) for coupling the display panel 100 with the cover member 200. Alternatively, the base member 310-C in which the recessed portion is not defined may be an optical film or a touch screen panel. The base member 310-C in which the recessed portion is not defined may be a functional member (e.g., a predetermined functional member), which may be located between the display panel 100 and the cover member 200.

While the base member 310-C in which the recessed portion is not defined is illustrated for convenience of explanation for comparison with the display device DS in accordance with the present disclosure, a similar comparison in which the base member 310-C is omitted and the display panel 100 and the cover member 200 are directly stacked may be applied.

As shown in FIG. 3A, when the light guide member 300 is not included, a leaking light L-SC1 may enter into the bezel area BA, and may be incident onto the color layer 220. In this case, when the color layer 220 is made of a material having high reflectance, the leaking light L-SC1 may be reflected from the color layer 220, and may be emitted to the outside of the cover member 200. Accordingly, a light leakage phenomenon in which a user may view the light in the bezel area BA may occur.

Unlike the display device DS-C of FIG. 3A, the leaking light L-SC2 of the display device DS, according to an embodiment of the present inventive concept, may be guided by the light guide member 300 as shown in FIG. 3B. For example, the leaking light L-SC2 reaches the filling portion 320 before the color layer 220.

The path of the leaking light L-SC2 incident onto the filling portion 320 is changed by the filling portion 320. Because the filling portion 320 has a relatively lower refractive index than that of the base member 310, the leaking light L-SC2 may be reflected and/or partially absorbed by the filling portion 320, and thus, may be refracted at a greater angle than the incident angle.

The filling portion 320 in accordance with an example embodiment of the present disclosure has a shape corresponding to the recessed portion 310-G. The recessed portion 310-G has a shape that may be adapted to perform reflection (e.g., total reflection). Thus, even when a portion of light is refracted and incident into the filling portion 320, it may be reflected (e.g., totally reflected) by the recessed portion 310-G.

Accordingly, though light leaking from the display device DS occurs, the leaking light is guided and advanced to the outside of the display device DS by the light guide member 300, and is extinguished. The leaking light L-SC2 may not be easily viewable by a user from the outside, and therefore, the light leakage phenomenon in the display device DS may be prevented or substantially prevented from occurring.

Figure 4A:
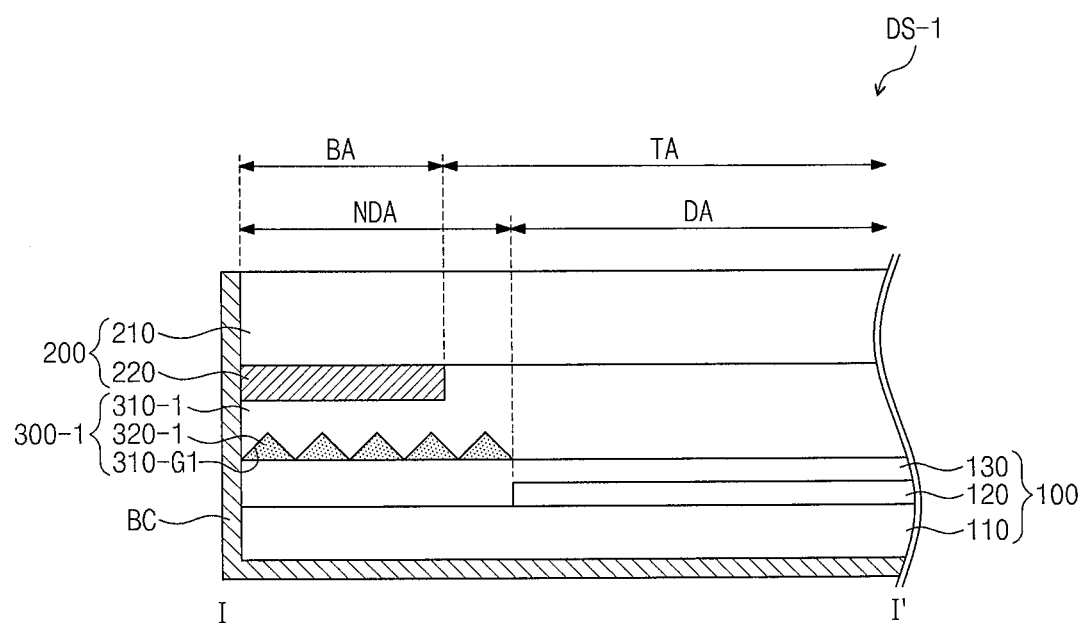
FIG. 4A is a partial cross-sectional view of a display device in accordance with an embodiment of the present inventive concept.
Figure 4B:
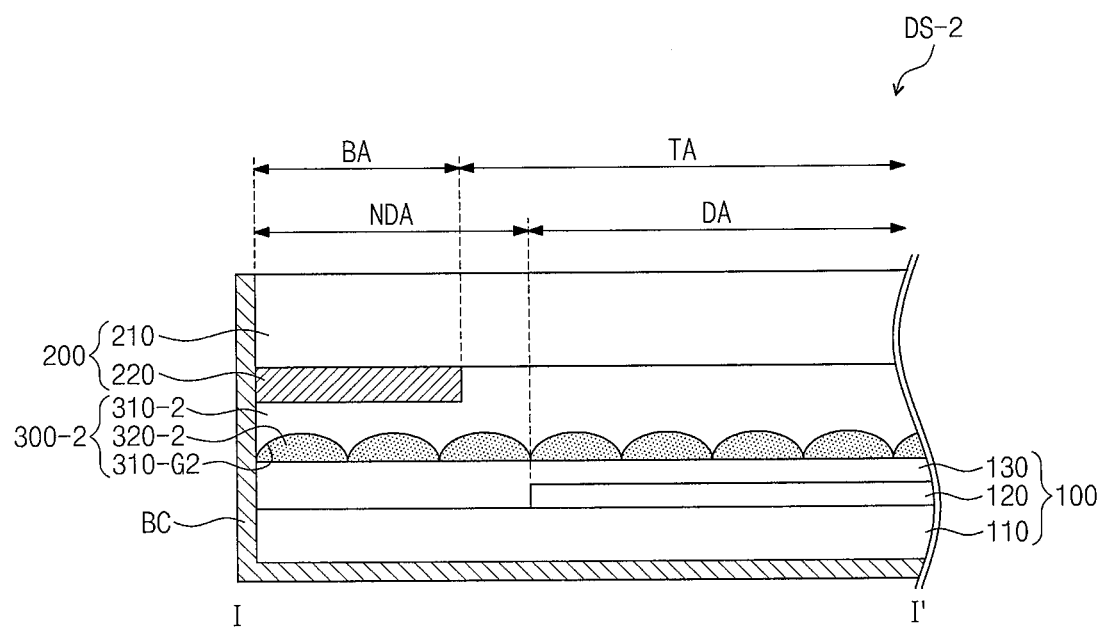
FIG. 4B is a partial cross-sectional view of a display device in accordance with an embodiment of the present inventive concept.

FIG. 4A is a partial cross-sectional view of a display device in accordance with an embodiment of the inventive concept. FIG. 4B is a partial cross-sectional view of a display device in accordance with an embodiment of the inventive concept. For convenience of explanation, FIG. 4A and FIG. 4B illustrate an area of the display device corresponding to the area shown in FIG. 2B. Hereinafter, the same reference numerals are given to the same or substantially the same elements as those illustrated in FIG. 1 through FIG. 2B, and duplicate description thereof will be omitted.

Recessed portions 310-G1 are defined such that light that has passed through a filling portion 320-1 may be reflected (e.g., totally reflected). Thus, as shown in FIG. 4A, a display device DS-1 may include the filling portion 320-1 having a triangular shape in a cross section. That is, each of the recessed portions 310-G1 that is recessed in the triangular shape in a cross section is defined on a base member 310-1.

Lights incident into the recessed portions 310-G1 through the filling portion 320-1 are reflected (e.g., totally reflected) from the recessed portions 310-G1 having the triangular shape. Thus, though a portion of leaking lights is transmitted through the filling portion 320-1, the portion of leaking light is reflected by the recessed portions 310-G1, and therefore, is not transmitted to the cover member 200.

According to another embodiment of the present inventive concept, the recessed portions 310-G1 may be spaced from each other by a distance (e.g., a predetermined distance or gap). The gap between the recessed portions 310-G1 is defined as a plane, and may have the same or substantially the same thickness as an area of the base member 310-1 on which the recessed portions 310-G1 are not disposed.

However, the present inventive concept is not limited to that shown in FIG. 4A, and the light guide member 300-1 may have a variety of suitable shapes, such as a semi-oval shape and/or a polygonal shape in a cross section, to reflect (e.g., totally reflect) the lights towards a lower side thereof.

As shown in FIG. 4B, recessed portions 310-G2 may extend to an area overlapping with a display area DA. Recessed portions 310-G2 may include the recessed portions 310-G in FIG. 2B, and may further include recessed portions that do not overlap with the bezel area BA. In this case, a filling portion 320-2 overlaps with both the display area DA and a peripheral area NDA.

When light is incident into the recessed portions 310-G2 at an oblique angle with respect to surfaces of the recessed portions 310-G2, the recessed portions 310-G2 reflect (e.g., totally reflect) the incident light. When light is incident into the recessed portions 310-G2 at a right angle with respect to the surfaces of the recessed portions 310-G2, the recessed portions 310-G2 transmit the incident light. Thus, even though the recessed portions 310-G2 overlap the display area DA, images that are vertically emitted towards a front surface of the display area DA may be viewed from the outside.

Figure 5:
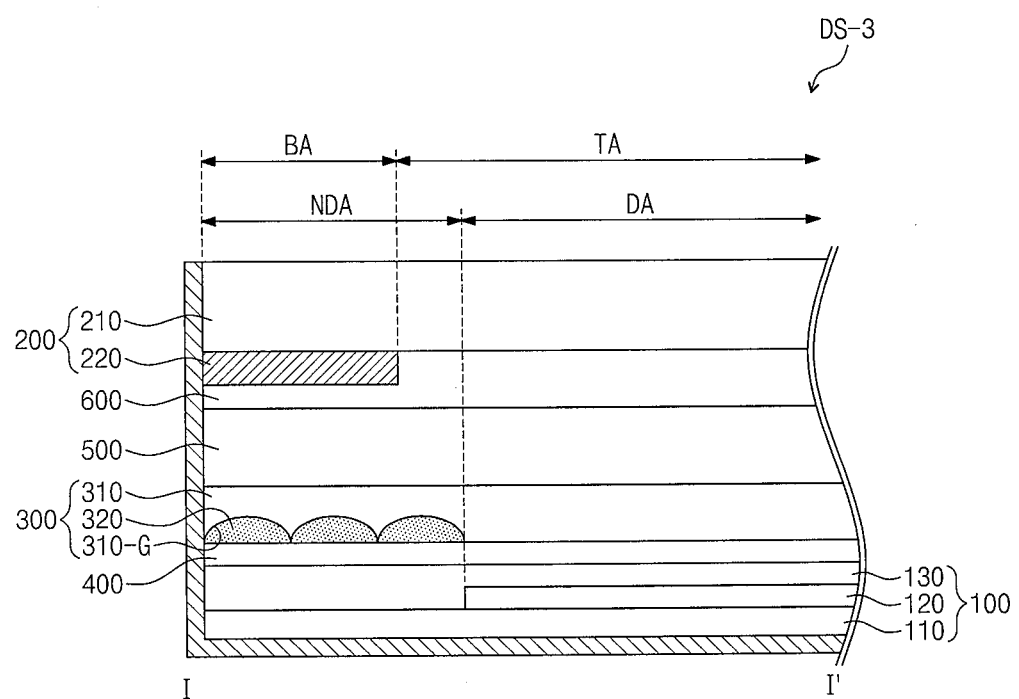
FIG. 5 is a partial cross-sectional view of a display device in accordance with an embodiment of the present inventive concept.

FIG. 5 is a partial cross-sectional view of a display device in accordance with an embodiment of the inventive concept. For convenience of explanation, FIG. 5 illustrates an area of the display device corresponding to the area shown in FIG. 2A. Hereinafter, the same reference numerals are given to the same or substantially the same elements as those shown in FIG. 1 through FIG. 4A, and duplicate descriptions thereof will be omitted.

As shown in FIG. 5, a display device DS-3 may further include a plurality of layers. The plurality of layers includes a first function layer 400, a second function layer 500, and a third function layer 600.

The first function layer 400 may be located between the display panel 100 and the light guide member 300. The first function layer 400 may include a variety of embodiments.

For example, the first function layer 400 may include a touch layer including a plurality of touch cells. The first function layer 400 may receive and process a touch input signal generated on a surface (e.g., a front or top surface) of the cover member 200.

Alternatively, the first function layer 400 may include an optical member (or optical layer). The first function layer 400 may improve visibility of light incident from the outside by reducing reflectance. However, the present inventive concept is not limited thereto, and the first function layer 400 is not limited to any of the above-described embodiments.

A filling portion 320 may be in contact (e.g., direct contact) with the first function layer 400. Accordingly, the filling portion 320 may have a lower refractive index than that of the first function layer 400.

The second function layer 500 may be located between a cover member (or cover) 200 and a light guide member (or light guide) 300. The second function layer 500 may include a variety of embodiments.

For example, the second function layer 500 may include a touch panel. In this case, the first function layer 400 may not include a touch layer. Because the second function layer 500 is located relatively closer to the cover member 200, in which a touch input signal is generated, than the first function layer 400, the touch sensitivity of the display device DS-3 may be improved.

The third function layer 600 is located between the second function layer 500 and the cover member 200. The third function layer 600 may include a variety of embodiments.

For example, the third function layer 600 may include an adhesive layer. The third function layer 600 may remove a step height difference, which may occur between a color layer 220 and a base substrate 210.

The third function layer 600 stably fixes the second function layer 500 and the cover member 200. The third function layer 600 may be optically transparent, so that the visibility is not affected.

However, the present inventive concept is not limited thereto, and the second function layer 500 and the third function layer 600 may be provided in a variety of embodiments.

Figure 6:
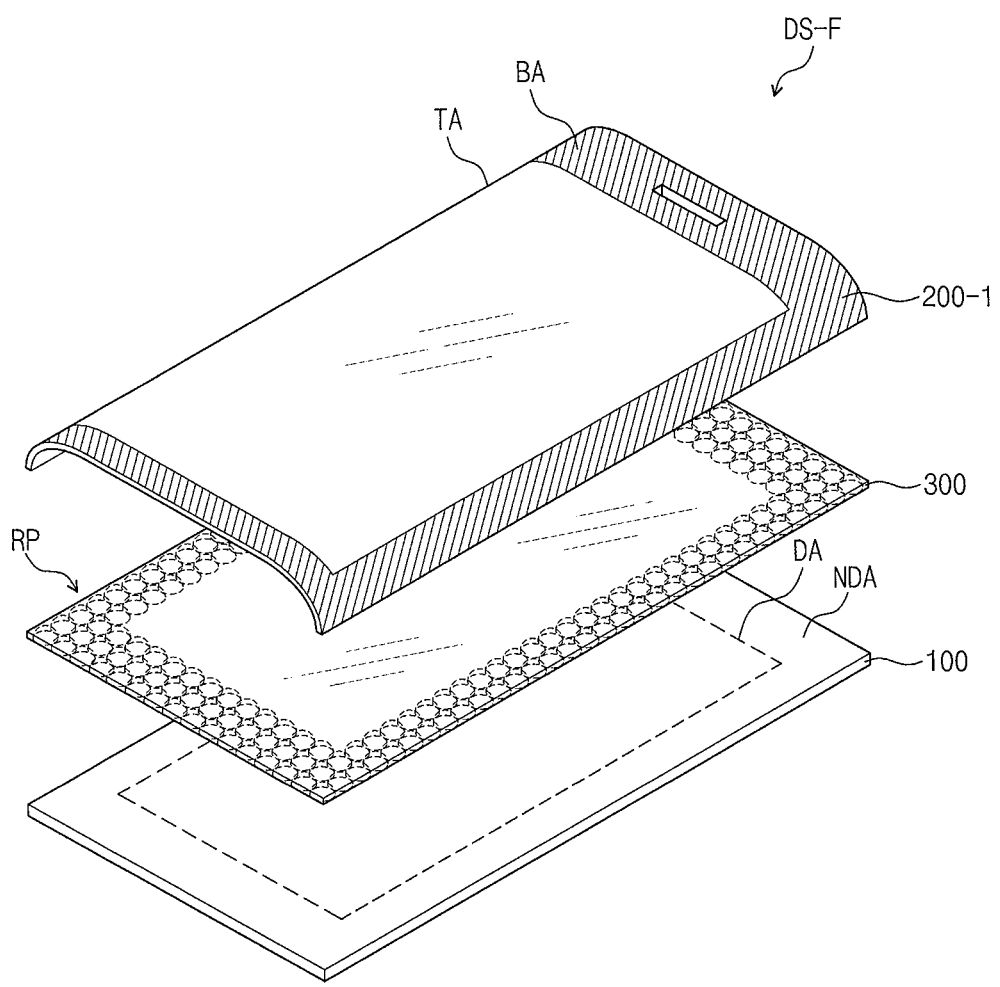
FIG. 6 is an exploded perspective view of a display device in accordance with an embodiment of the present inventive concept.
Figure 7:
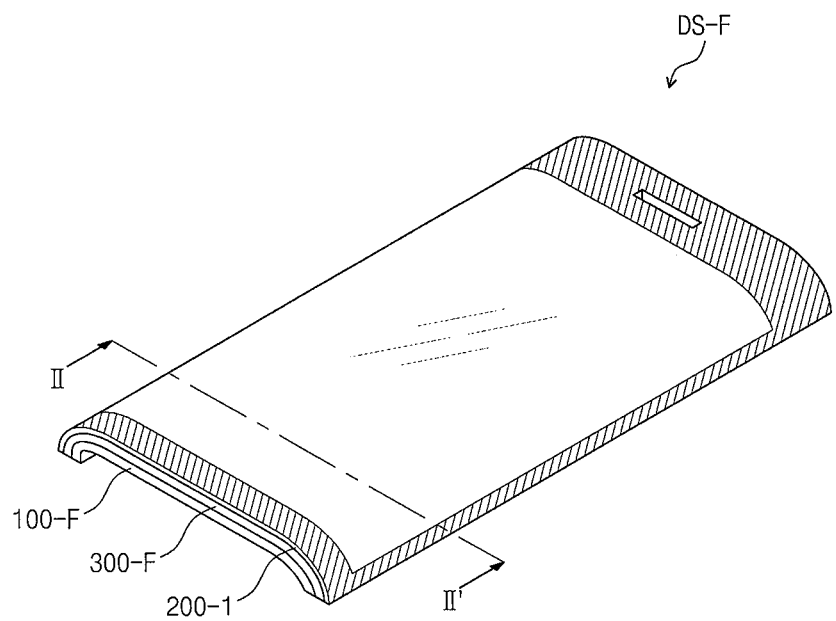
FIG. 7 is a perspective view of the display device of FIG. 6 in a coupled state.
Figure 8:
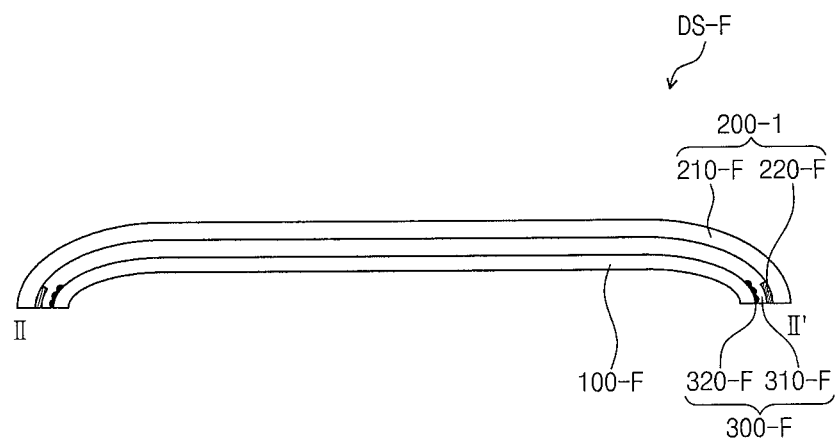
FIG. 8 is a cross-sectional view taken along the line II-II' of FIG. 7.

FIG. 6 is an exploded perspective view of a display device in accordance with an embodiment of the inventive concept. FIG. 7 is a perspective view of the display device of FIG. 6 in a coupled state. FIG. 8 is a cross-sectional view taken along the line II-II' in FIG. 7.

As shown in FIG. 6 through FIG. 8, a display device DS-F includes a curved cover member 200-1. For convenience of explanation, a housing member is omitted in the illustration of FIG. 6 through FIG. 8. Hereinafter, the same reference numerals are given to the same or substantially the same elements as those illustrated in FIG. 1 through FIG. 5, and duplicate description thereof will be omitted.

The curved cover member 200-1 may be curved downward along a bending axis (e.g., a predetermined bending axis). Thus, the curved cover member 200-1 has a curved shape.

The curved cover member 200-1 may be fixed in a curved state. Thus, the curved cover member 200-1 may maintain or substantially maintain the curved shape against an external shock, and may provide reliable protection to the inner components and elements.

The display device DS-F has a curved shape when in a coupled state. Thus, a display panel 100 and a light guide member 300 may be curved as a curved display panel 100-F and a curved light guide member 300-F, respectively, to form the display device DS-F. The display device DS-F has a shape corresponding to the curved cover member 200-1.

The display panel 100 may have a flexible characteristic. Thus, the display panel 100 may include a thin film structure. For example, the display panel 100 may include an organic light emitting display panel including a thin film encapsulation layer. However, the present inventive concept is not limited thereto, and the display panel 100 may include any suitable flexible display panel.

A touch cell configured to detect an external touch input may be further located on the display panel 100. In this case, the touch cell may be mounted (e.g., directly mounted) on the display panel 100 for flexibility of the display panel 100.

The display panel 100 may be curved along the shape of the curved cover member 200-1.

The light guide member 300 may be curved to correspond to the curved cover member 200-1, because the light guide member 300 may have the flexible characteristic. The curved light guide member 300-F may include a curved base member 310-F and a curved filling portion 320-F.

Thus, a recessed pattern RP may be located on a curved surface. The recessed pattern RP may be provided to a variety of surfaces including a plane and a curved surface. Accordingly, the display device in accordance with an embodiment of the inventive concept may prevent or reduce a light leakage phenomenon by including the recessed pattern RP, without limiting the shape of the display device.

As described above, according to one or more embodiments of the inventive concept, a display device includes a light guide member including at least one recessed pattern. The recessed pattern may be defined by a recessed portion and a filling portion defined on a base member.

The light guide member has a refractive index in an area in which the recessed pattern is located that is different to that of an area adjacent to the recessed pattern. The recessed pattern guides light leaking to a bezel area, such that the light is not emitted to the bezel area. Accordingly, a light leakage phenomenon that may occur in the bezel area may be prevented or reduced.

The above-described embodiments are to be considered illustrative and not restrictive, and the appended claims and their equivalents are intended to cover member all such modifications, enhancements, and other embodiments, which fall within the spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A display device comprising:
    a display panel divided into a display area and a peripheral area, the peripheral area being adjacent to the display area;
    a cover member on the display panel, the cover member being divided into a transmission area overlapping with the display area and a bezel area overlapping with the peripheral area; and
    a light guide member between the cover member and the display panel, the light guide member comprising a base member comprising at least one recessed portion overlapping with the peripheral area and a lower surface facing the display panel and an upper surface opposite the lower surface, and a filling portion at the recessed portion,
    wherein the recessed portion is recessed toward the cover member from the lower surface in a thickness direction of the base member and has a semicircular shape convex toward the cover member, in a cross section.

2. The display device in claim 1, wherein the filling portion has a lower refractive index than that of the base member.

3. The display device in claim 2, wherein the base member comprises a plastic substrate.

4. The display device in claim 2, wherein the base member comprises an optical clear adhesive (OCA) member, a pressure sensitive adhesive (PSA) member, or an optical clear resin (OCR) member.

5. The display device in claim 4, wherein the filling portion comprises air.

6. The display device in claim 1, wherein the recessed portion comprises a plurality of recessed portions, and the plurality of recessed portions overlaps with at least the bezel area at a lower side of a base substrate of the cover member.

7. The display device in claim 6, wherein the plurality of recessed portions further overlaps with the transmission area at the lower side of the base substrate.

8. The display device in claim 1, wherein the cover member comprises:
   a base substrate overlapping with the transmission area and the bezel area; and
   a color layer under the base substrate and defining the bezel area.

9. The display device in claim 8, wherein the color layer is configured to reflect incident light.

10. The display device in claim 1, further comprising a touch member between the light guide member and the cover member, the touch member being configured to detect an external touch signal.

11. A display device comprising:
   a display panel configured to display an image;
   a cover member on the display panel, the cover member being divided into a transmission area for transmitting the image and a bezel area adjacent to the transmission area, and the cover member being curved based on a first direction; and
   a light guide member between the cover member and the display panel, the light guide member comprising a base member comprising recessed portions, and a filling portion at the recessed portions,
   wherein at least one of the recessed portions overlaps with the bezel area, and
   wherein each of the recessed portions is recessed toward the cover member from a lower surface of the base member in a thickness direction of the base member, and has a semicircular shape convex toward the cover member, in a cross section.

12. The display device in claim 11, wherein the display panel comprises:
   a base layer;
   a display layer on the base layer and comprising a plurality of pixels on a display area; and
   a sealing layer on the display layer and covering the pixels,
   wherein the display panel is curved along the first direction.

13. The display device in claim 11, wherein the filling portion has a lower refractive index than that of the base member.

14. The display device in claim 13, wherein the filling portion comprises air.

* * * * *